United States Patent
Kee et al.

(10) Patent No.: US 12,375,856 B2
(45) Date of Patent: *Jul. 29, 2025

(54) VOLUME CONTROL FOR AN ELECTRONIC DEVICE

(71) Applicant: MOTOROLA SOLUTIONS, INC., Chicago, IL (US)

(72) Inventors: Cheah Chan Kee, Gelugor (MY); Lee Sun Ooi, Kulim (MY); Kok Seng Ang, Bukit Mertajam (MY); Jie Wen Loh, Taiping (MY); Kiam Beng Loh, Simpang Ampat (MY)

(73) Assignee: MOTOROLA SOLUTIONS INC., Chicago, IL (US)

( * ) Notice: Subject to any disclaimer, the term of this patent is extended or adjusted under 35 U.S.C. 154(b) by 121 days.

This patent is subject to a terminal disclaimer.

(21) Appl. No.: 18/331,202

(22) Filed: Jun. 8, 2023

(65) Prior Publication Data

US 2024/0414476 A1 Dec. 12, 2024

(51) Int. Cl.
*H04R 5/04* (2006.01)
*G01B 7/30* (2006.01)
*G05G 1/10* (2006.01)

(52) U.S. Cl.
CPC ........... *H04R 5/04* (2013.01); *G01B 7/30* (2013.01); *G05G 1/10* (2013.01); *H04R 2410/00* (2013.01); *H04R 2430/01* (2013.01)

(58) Field of Classification Search
None
See application file for complete search history.

(56) References Cited

U.S. PATENT DOCUMENTS

| | | | | |
|---|---|---|---|---|
| 5,513,268 | A | * | 4/1996 | Bironas .................... H03J 1/22 381/104 |
| 5,745,057 | A | * | 4/1998 | Sasaki .................... H03G 3/001 341/35 |
| 7,382,066 | B2 | | 6/2008 | Foster et al. |
| 7,596,233 | B2 | * | 9/2009 | Hsieh .................. H03G 1/0088 381/109 |
| 8,188,989 | B2 | | 5/2012 | Levin et al. |
| 8,913,759 | B2 | * | 12/2014 | Park ....................... G06F 3/165 381/104 |
| 9,112,466 | B1 | * | 8/2015 | Koh ......................... H03G 3/04 |
| 9,729,958 | B2 | * | 8/2017 | Jaques ................. H04R 1/1041 |

(Continued)

FOREIGN PATENT DOCUMENTS

WO    2020240612 A1    12/2020

OTHER PUBLICATIONS

Í. A. Lima, M. S. Alencar, W. T. A. Lopes and F. Madeiro, "Evaluation of optimal and sub-optimal speech noise reduction wiener filters," 2015 International Workshop on Telecommunications (IWT), Santa Rita do Sapucai, Brazil, 2015, pp. 1-5, doi: 10.1109/IWT.2015.7224581.

*Primary Examiner* — Paul W Huber
(74) *Attorney, Agent, or Firm* — Daniel R Bestor (57) ABSTRACT

A method and apparatus for performing noise suppression on an electronic device is provided herein. During operation, a volume-control knob will increase a volume of sound output from a device in a substantially linear fashion (versus knob rotation angle) as a volume-control knob is rotated in a first direction. Noise suppression on the electronic device will also increase as the volume-control knob is rotated in the first direction.

15 Claims, 7 Drawing Sheets

(56) References Cited

U.S. PATENT DOCUMENTS

| | | | |
|---|---|---|---|
| 9,910,515 B2* | 3/2018 | Richards | G06F 3/162 |
| 10,051,228 B2* | 8/2018 | Ishihara | H04N 21/4852 |
| 10,051,359 B2* | 8/2018 | Liu | H04R 1/1008 |
| 10,084,423 B1* | 9/2018 | Goldstein | H03G 3/342 |
| 10,320,354 B1* | 6/2019 | Goldman-Shenhar | H03G 3/02 |
| 10,402,077 B2 | 9/2019 | O'Mahony et al. | |
| 10,863,267 B2* | 12/2020 | Silva | H04R 3/00 |
| 11,863,955 B1* | 1/2024 | Schillebeeckx | G10H 1/0091 |
| 2002/0031236 A1* | 3/2002 | Shimizu | H04R 3/00 |
| | | | 381/104 |
| 2010/0014004 A1* | 1/2010 | Dai | H03G 7/007 |
| | | | 348/734 |
| 2014/0185834 A1* | 7/2014 | Fromel | G06F 3/011 |
| | | | 381/109 |
| 2016/0089028 A1* | 3/2016 | Chatterjee | G06F 3/011 |
| | | | 340/870.07 |
| 2017/0126192 A1* | 5/2017 | Fu | H04R 3/00 |
| 2018/0014973 A1* | 1/2018 | Echeverri | H04R 1/105 |
| 2023/0007398 A1* | 1/2023 | Carrigan | H04R 29/001 |
| 2024/0303033 A1* | 9/2024 | Mogul | H04R 1/1041 |

\* cited by examiner

VOLUME CONTROL FOR AN ELECTRONIC DEVICE

RELATED APPLICATIONS

This patent application is related to U.S. patent application Ser. No. 18,331,198, entitled, VOLUME CONTROL FOR AN ELECTRONIC DEVICE. Both this application, and the related application are assigned to the same assignee, and filed on the same day.

BACKGROUND

A device that comprises a volume-control knob will increase/decrease its volume in a substantially linear fashion as the volume-control knob is rotated. In other words, as a user rotates the volume-control knob on the device, the volume will increase/decrease in a linear fashion based on an angle through which the knob is rotated. In addition to controlling volume via a volume-control knob, many devices will also comprise a volume-boost feature that increases a volume to a maximum amount, above what could be achieved by simply rotating the volume-control knob. The volume-boost feature is oftentimes cumbersome to access, requiring a dedicated button be pushed, or that several menus be navigated in order to activate a volume-boost. It would be beneficial if the volume-boost feature could be more-easily activated.

BRIEF DESCRIPTION OF THE SEVERAL VIEWS OF THE DRAWINGS

In the accompanying figures similar or the same reference numerals may be repeated to indicate corresponding or analogous elements. These figures, together with the detailed description, below are incorporated in and form part of the specification and serve to further illustrate various embodiments of concepts that include the claimed invention, and to explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help improve understanding of embodiments of the present disclosure.

The system, apparatus, and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION OF THE INVENTION

In order to more-easily activate a volume-boost, a method and apparatus for volume control of an electronic device is provided herein. During operation, a volume-control knob will increase a volume of sound output from a device in a substantially linear fashion (versus knob rotation angle) as a volume-control knob is rotated. Once the volume-control knob is rotated past a predetermined amount, a volume boost is activated, increasing the volume level in a non-linear fashion. More particularly, in one embodiment of the present invention, once the volume-control knob is rotated past the predetermined amount (e.g., 300 degrees), the volume will be increased instantaneously by, for example, 25%.

In an alternate embodiment of the present invention, an aggressiveness of noise-suppression circuitry is increased after the volume-control knob is rotated past a second predetermined amount (which may equal the first predetermined amount).

Example embodiments are herein described with reference to flowchart illustrations and/or block diagrams of methods, apparatus (systems) and computer program products according to example embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a special purpose and unique machine, such that the instructions, which execute via the processor of the computer or other programmable data processing apparatus, create means for implementing the functions/acts specified in the flowchart and/or block diagram block or blocks. The methods and processes set forth herein need not, in some embodiments, be performed in the exact sequence as shown and likewise various blocks may be performed in parallel rather than in sequence. Accordingly, the elements of methods and processes may be referred to herein as "blocks" rather than "steps."

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer, radio, smart phone, or other programmable data processing apparatus that may be on or off-premises, or may be accessed via the cloud in any of a software as a service (Saas), platform as a service (PaaS), or infrastructure as a service (IaaS) architecture so as to cause a series of operational blocks to be performed on the computer or other programmable apparatus to produce a computer implemented process such that the instructions which execute on the computer or other programmable apparatus provide blocks for implementing the functions/acts specified in the flowchart and/or block diagram block or blocks. It is contemplated that any part of any aspect or embodiment discussed in this specification can be implemented or combined with any part of any other aspect or embodiment discussed in this specification. Further advantages and features consistent with this disclosure will be set forth in the following detailed description, with reference to the figures.

Figure 1:
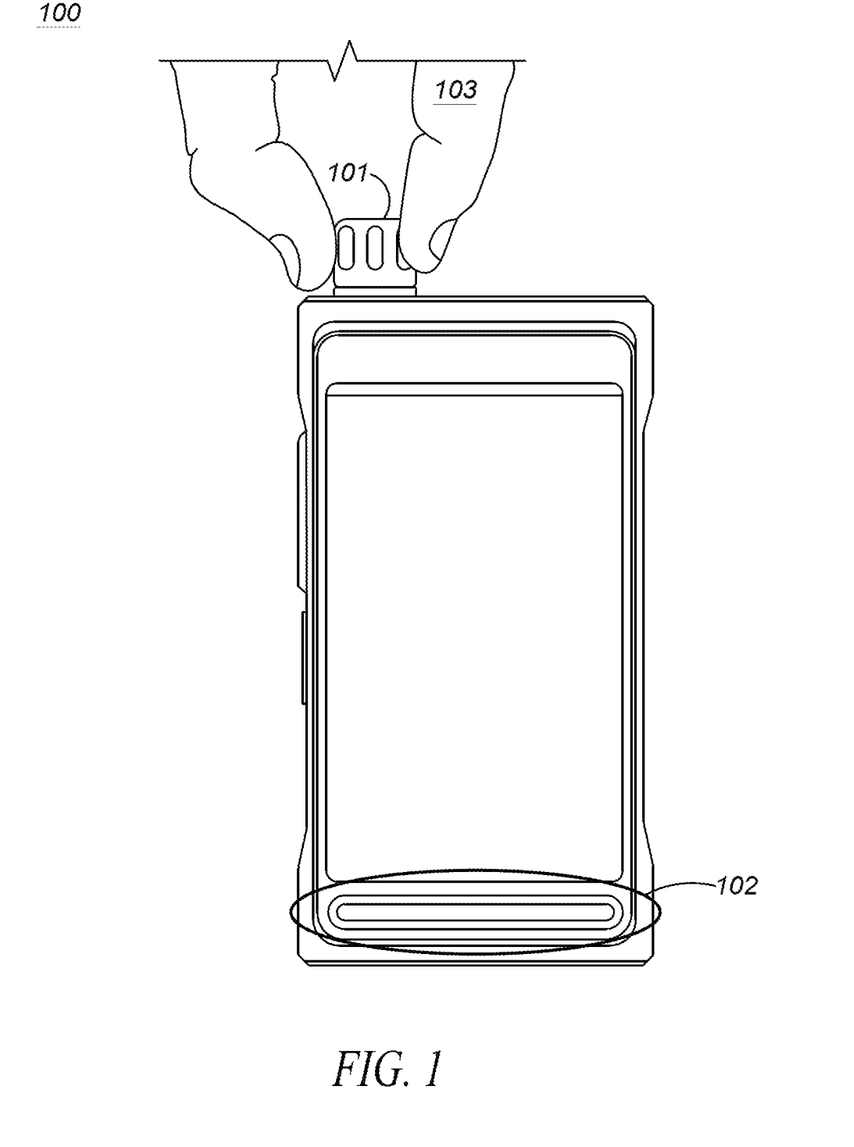
FIG. 1 illustrates a device having a volume-control knob.

Referring now to the drawings, FIG. 1 illustrates device 100 having volume-control knob 101. In one embodiment of the present invention, knob 101 comprises a haptic rotary knob that provides haptic feedback to the user as they rotate the knob. The feedback may be generated electronically through motors, magnets, . . . , etc., or alternatively, the feedback may be provided by mechanical means, through indents, gears, . . . , etc. Rotary knob 101 allows the user to directly manipulate at least a volume output from device 100. Knob 101 is approximately a cylindrical object. Knob 101 can alternatively be implemented as a variety of different objects, including conical shapes, spherical shapes, dials, cubical shapes, rods, etc., and may have a variety of different textures on their surfaces, including bumps, lines, or other grips, or projections or members extending from the circumferential surface.

User 103 preferably grips or contacts the circumferential surface of knob 101 and rotates it a desired amount to increase or decrease a volume of sound output from speaker 102. The initial positive rotation, from zero degrees preferably powers up device 100. Continued positive rotation increases a volume level output from speaker 102, while negative rotation decreases the volume level. Haptic feedback can be provided to distinguish between transitions between power up and volume control. The Haptic feedback is preferably a tactile feedback which takes advantage of a sense of touch by applying forces, vibrations, or motions to knob 101.

Figure 2:
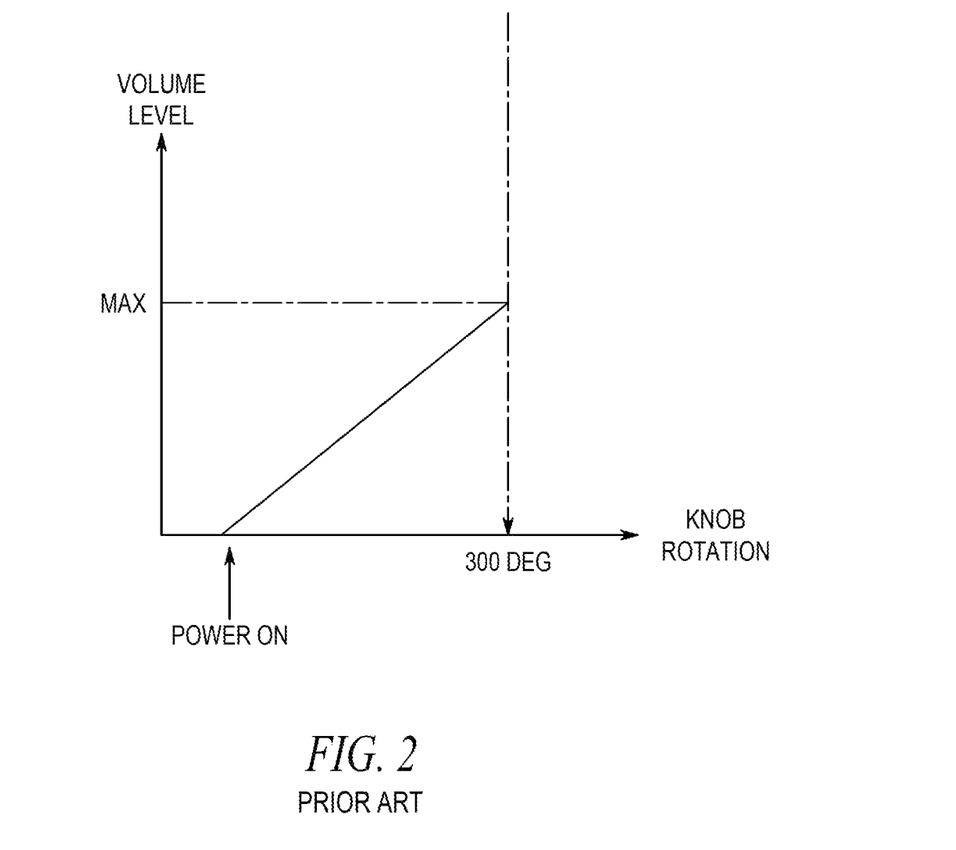
FIG. 2 illustrates the prior-art linear nature of volume output versus rotation of a volume-control knob.

As discussed above, prior art volume control increases the volume of device 100 in a linear fashion versus knob rotation angle. This is illustrated in FIG. 2. More particularly, FIG. 2 illustrates volume level versus knob rotation angle. As is evident, after knob 101 is rotated through power on, the volume of sound output from speaker 102 will increase in a linear fashion until a maximum volume is reached. Knob 101 is usually not allowed to travel beyond the point of maximum volume (e.g., 300 degrees). Any volume boost from maximum volume will take place by accessing menus and/or buttons other than knob 101.

In order to more-easily activate the volume-boost function, volume-control knob 101 will increase a volume of sound output from a device in a substantially linear fashion as knob 101 is rotated. Once the volume-control knob is rotated past a predetermined amount (e.g., 300 degrees), a volume boost is activated, increasing the volume level in a non-linear fashion. More particularly, in one embodiment of the present invention, once the volume-control knob is rotated past the predetermined amount, the volume will be increased instantaneously by a predetermined amount (e.g., 25%). Haptic feedback can be provided to distinguish transitions to volume boost. Volume boost is illustrated in FIG. 3.

Figure 3:
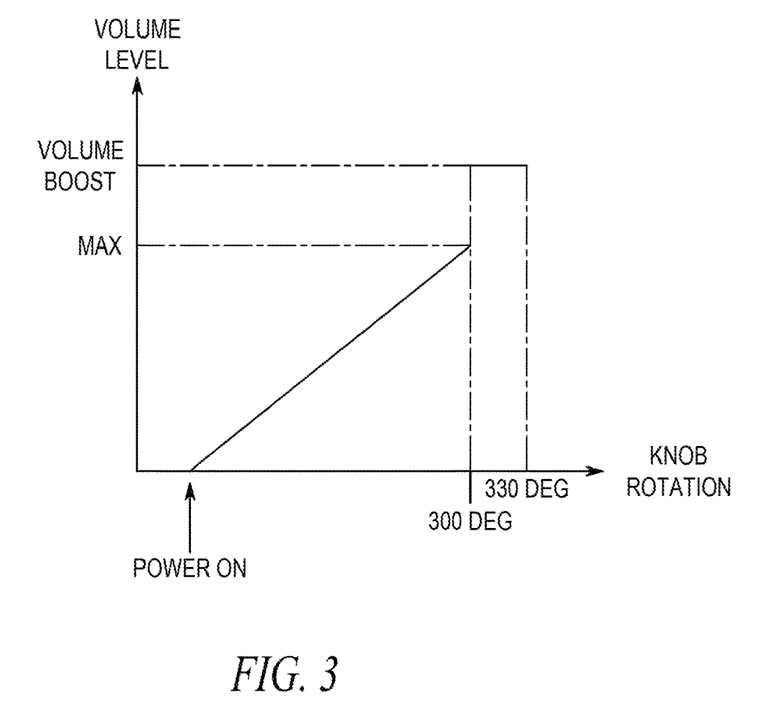
FIG. 3 illustrates a non-linear nature of volume output versus rotation of a volume-control knob in accordance with one embodiment of the present invention.

FIG. 3 illustrates a graph of volume level versus knob rotation. As is evident, after power on, the volume increases and decreases in a linear fashion versus knob rotation angle up to a certain point (e.g., 270 or 300 degrees). Rotation beyond that point may trigger a haptic feedback while instantaneously increasing the volume by a predetermined amount (e.g., 25%), performing a volume-boost function. In one embodiment of the present invention, haptic feedback provides a resistance at the transition to volume boost to indicate that further rotation will result in a volume boost. Rotation beyond resistance requires a higher torque to differentiate linear increase of volume vs an instantaneous increase in volume. As discussed, haptic feedback is particularly useful to distinguish the transition, or border, between functions as knob 101 is rotated. This is illustrated in FIG. 4.

Figure 4:
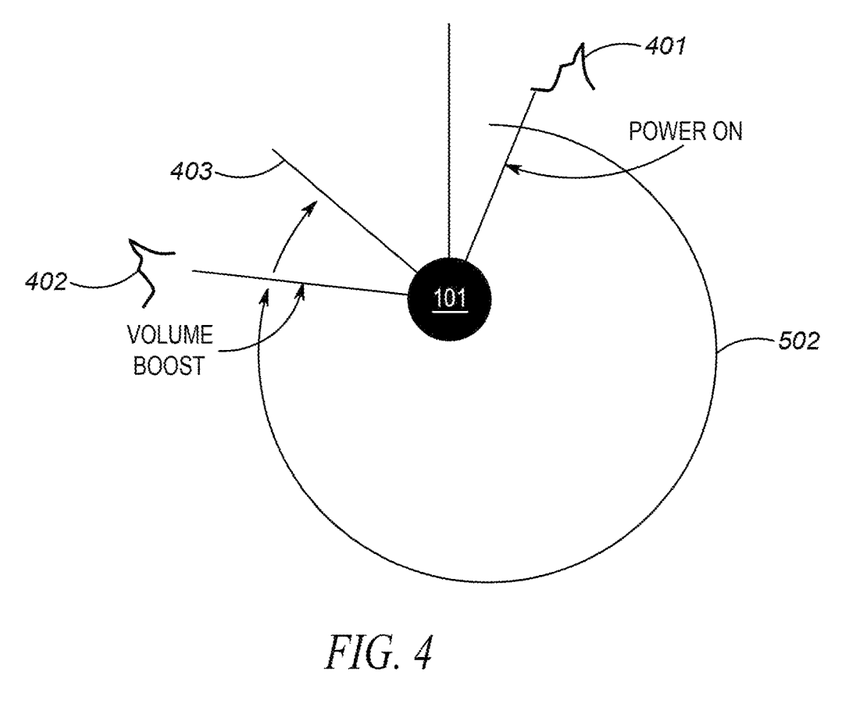
FIG. 4 illustrates a haptic effect versus angle shown in FIG. 3 as applied to the knob of FIG. 1.

More particularly, FIG. 4 illustrates a haptic effect applied when rotating a knob from power on through volume-boost. In particular graphs 401 and 402 are shown that plots an intensity of force, vibration, or motion applied to the knob versus angle of rotation for knob 101. As knob 101 is rotated, its angle increases up to some maximum angle at 403. Little to no haptic effect (forces, vibrations, or motions) is provided to knob 101 until power on occurs. As knob 101 is rotated through volume boost (e.g., approximately 300 degrees), user 201 is notified of the transition to volume boost by haptic effect 402 applied to knob 101. The intensity of the haptic effect (e.g., an amount of force, vibration, or motion) increases as the border between transitions. As shown in FIG. 4, once the transition is made, the haptic effect is reduced. It should be noted that although the haptic feedbacks at power up and volume boost are shown in FIG. 4 to be similar. In alternate embodiments of the present invention, the type, variation, and lengths of the haptic feedbacks may differ, creating a different "feeling" for the user at the transitions between power on and volume boost. In one embodiment, these haptic feedbacks are simply provided through mechanical means as known in the art (e.g., indents that engage with knob 101), however, in alternate embodiments of the present invention, haptic feedback may be provided to the user as they rotate knob 101 through electronic means. This may be provided by mechanical means (e.g., magnets, actuators, vibration modules, . . . , etc).

Figure 5:
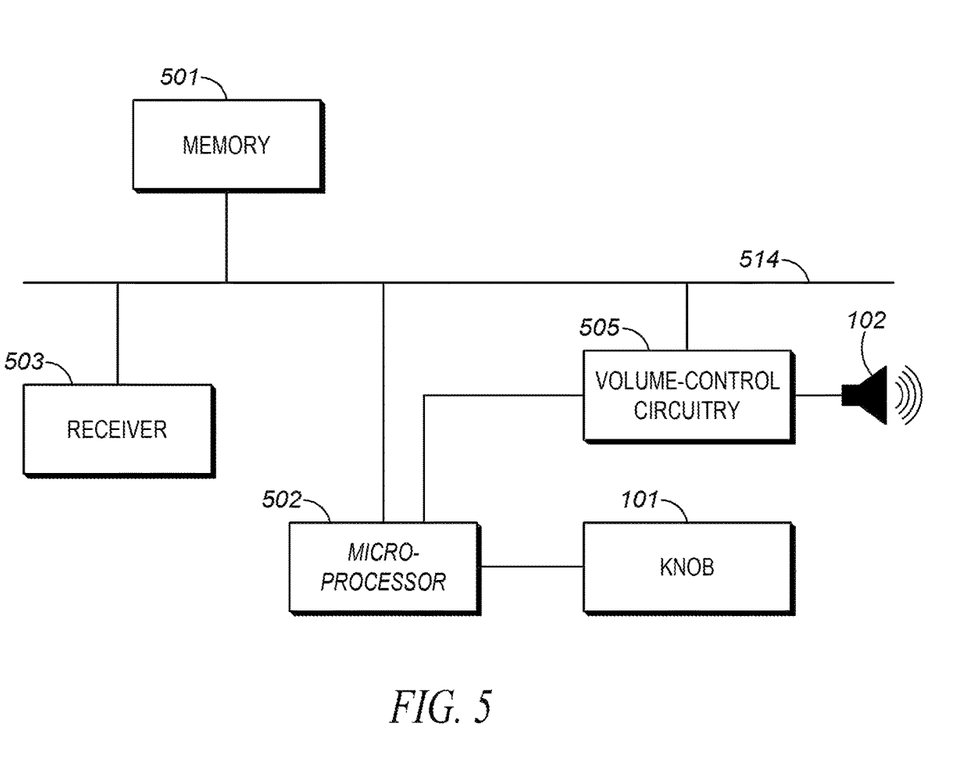
FIG. 5 is a block diagram of the device of FIG. 1.

FIG. 5 is a block diagram of device 100 of FIG. 1. Device 100 may include various components connected by a bus 514. Device 100 may include a hardware processor (logic circuitry) 502 such as one or more central processing units (CPUs) or other processing circuitry able to provide any of the functionality described herein when running instructions (e.g., computer programs, computer code . . . , etc.). Processor 502 may be connected to memory 501 that may include a non-transitory machine-readable medium on which is stored one or more sets of instructions. Memory 501 may include one or more of static or dynamic storage, or removable or non-removable storage, for example. A machine-readable medium may include any medium that is capable of storing, encoding, or carrying instructions for execution by processor 502, such as solid-state memories, magnetic media, and optical media. Machine-readable medium may include, for example, Electrically Programmable Read-Only Memory (EPROM), Random Access Memory (RAM), or flash memory. The instructions stored in memory 501 enable device 100 to operate in any manner thus programmed, such as the functionality described specifically herein, when processor 502 executes the instructions.

Receiver 503 comprises any standard over-the-air receiver that utilize a private 802.11 network set up by a building operator, a next-generation cellular communications network operated by a cellular service provider, or any public-safety network such as an APCO 25 network or the FirstNet broadband network, LMR (Land mobile radio)

network such as analogue RF, DMR, TETRA. During operation, over-the-air transmissions that are received by receiver 503 are demodulated and sent through volume-control circuitry 505 before being audibly output through speaker 102.

Volume-control circuitry comprises well-known circuitry (amplifiers) that increases and decreases the amplitude (volume) of signals output to speaker 102. As discussed above, the amount of amplification of any input signal is dependent upon a position of knob 101, as shown in FIG. 3. Thus, during operation, knob 101 outputs an angle of rotation to microprocessor 502. The output may be in analog or digital form. In response, microprocessor 703 instructs volume-control circuitry 505 to adjust a volume (amplitude) of any signal input to volume control circuitry 505 from receiver 503 (or other inputs not shown).

With the above in mind, FIG. 5 shows an apparatus comprising a knob configured to be rotated, a speaker, volume control circuitry, and a processor (logic circuitry) running code that instructs the processor to determine a rotation angle of the knob and increase a volume of a speaker as the knob is rotated in a first direction such that the volume is increased in a continuous manner as the knob is rotated until the knob is rotated past a predetermined amount, after the knob is rotated past the predetermined amount the volume is increased instantaneously by at least 10 percent.

As discussed above, the volume may be increased in a substantially linear manner as the knob is rotated in the first direction until the knob is rotated past the predetermined amount.

Figure 6:
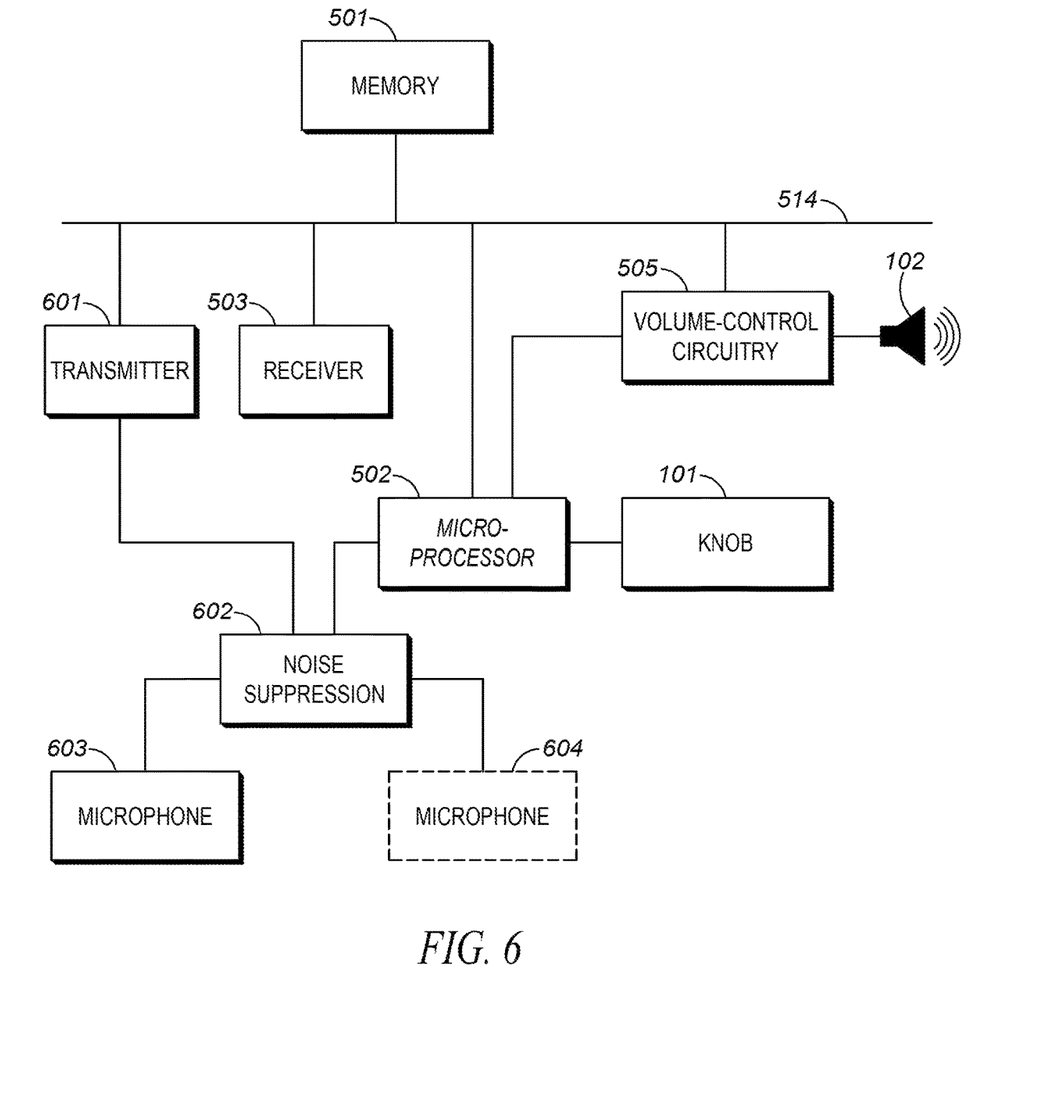
FIG. 6 is a block diagram of the device of FIG. 1 in accordance with an alternate embodiment of the present invention.
Figure 7:
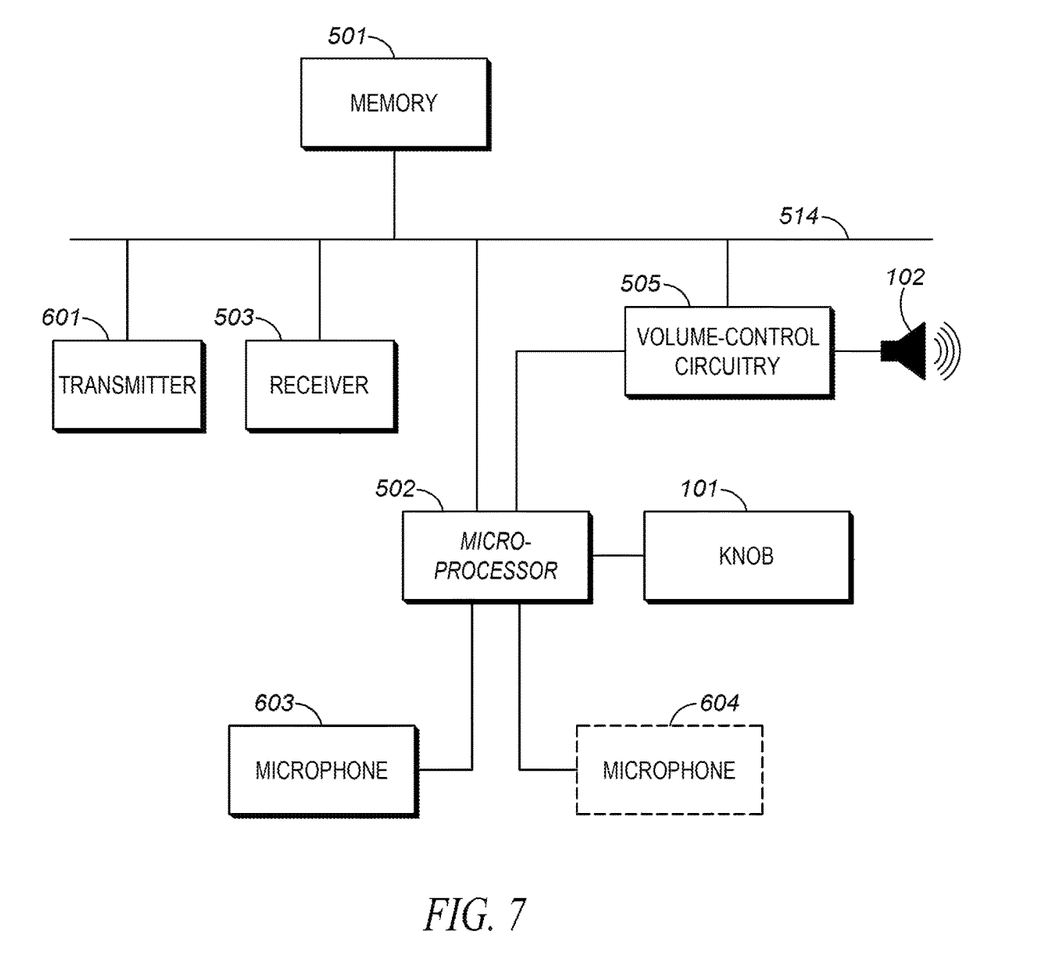
FIG. 7 is a block diagram of the device of FIG. 1 in accordance with an alternate embodiment of the present invention.

FIG. 6 is a block diagram of the device of FIG. 1 in accordance with an alternate embodiment of the present invention. In the alternate embodiment of the present invention, noise suppression circuitry 602 is provided and operated based on a position of knob 101. Noise suppression can comprise a software solution (executed by logic circuitry 502) where the microphone audio signal is processed by logic circuitry 502 in order to reduce background noise before being sent to transmitter 601. In an alternate embodiment, noise suppression may comprise a hardware solution where the microphone audio signal is processed by noises suppressor IC 602 before being sent to transmitter 601. The hardware solution is depicted in FIG. 6, while the software solution is depicted in FIG. 7.

As one of ordinary skills in the art will recognize, noise suppression (sometimes referred to as adaptive noise reduction (ANR)) reduces an amount of background noise transmitted over the air through transmitter 601. While single microphone and dual microphone solutions exist, dual microphone ANR solutions more quickly adapt to the changing background noise conditions, while providing minimal distortion to the desired source signal input from one of the two microphones. Adding a second microphone to a system design provides the ability to sample the noise of the acoustic environment. This noise reference signal (acoustic environment, or sometimes referred to as background noise) can be subtracted from the original microphone to greatly reduce background noise. Although a single microphone may be used, dual microphone ANR is often a better solution than single microphone noise reduction algorithms because the noise spectrum changes more quickly over time than the transfer function of the noise source.

Various algorithms for ANR exist. For example, in quiet environments, no noise suppression may take place, while basic noise suppression may take place in moderately noisy environments. Additionally, various levels of noise suppression may take place as background noise increases. The various levels of noise suppression are typically based on differing filter values used in the noise-suppression circuitry. For example, Wiener filtering is an industry standard for dynamic signal processing, and is used widely in hearing aids and other edge devices such as phones and communication devices. The adaptive filter works best given two audio signals: one with both the speech and the background noise and another that solely measures the background noise. Modern day smartphone designers will often place two microphones distanced from each other such that one is placed near the speaker's mouth to record the noisy speech and the other can measure the ambient noise to filter out the noise. Filter parameters may be adjusted based on an amount of background noise detected.

In the alternate embodiment of the present invention, the aggressiveness of any noise suppression (e.g., filter parameters, Weiner filter parameters, . . . , etc.) is based on knob rotation. More specifically, since an increase in volume is a good indicator of an increase in background noise, the aggressiveness for any noise suppression may be based on knob rotation (and hence, volume level, with higher volume levels (larger rotation angles of knob 101) indicating higher background noise that may require more aggressive noise control).

As an example of the above, in the paper Evaluation of Optimal and Sub-optimal Speech Noise Reduction Wiener Filters, by Alencar et. al, the ratio of speech distortion inserted by optimal and sub-optimal filter depends on the choice of parameter $\alpha$. This parameter may be varied based on volume level (knob rotation angle).

In one embodiment, noise suppression does not take place unless knob 101 is rotated past a predetermined amount (e.g, 300 degrees). In one embodiment, both noise suppression and volume boost will take place at the same time (e.g., knob rotated past 300 degrees). In this embodiment, no noise suppression or volume boost takes place unless knob 101 is rotated past a predetermined amount. After that point, both noise suppression and volume boost takes place.

In an alternate embodiment of the present invention, volume boost and noise suppression may take place independent of each other. For example, noise suppression may take place after rotating knob 101 a first predetermined amount, while volume boost may take place after rotating knob 101 a second predetermined amount.

In yet a further embodiment of the present invention, more aggressive noise suppression may take place as knob 101 is rotated. So for example, minimal or no noise suppression will take place until knob 101 is rotated past a first predetermined amount, then a more aggressive noise suppression will take place. More aggressive noise suppression may take place as the knob is further rotated past a second predetermined amounts.

With this in mind, FIG. 6 and FIG. 7 shows the addition of at least one microphone 603. 604, noise suppression circuitry 602, and transmitter 601 to the circuitry of FIG. 5. Microphones 603 and 604 provide a mechanism for receiving human voice and background noise, respectively. The human voice and noise are converted to electrical signals and passed to noise suppression circuitry 602 where the noise is subtracted from the voice. The resulting noise-suppressed signal is output to transmitter 601 where it is modulated in transmitted over the air.

Transmitter 601 preferably comprises a standard over-the-air transmitter that utilizes a private 802.11 network set up by a building operator, a next-generation cellular communications network operated by a cellular service provider, or any public-safety network such as an APCO 25 network or the FirstNet broadband network, LMR (Land mobile radio) network such as analogue RF. DMR, TETRA. During operation, over-the-air transmissions that are received by receiver 503 are demodulated and sent through volume-control circuitry 505 before being audibly output through speaker 102. During operation, the noise suppressed signal (e.g., human voice) from noise suppression circuitry 602 is modulated and transmitted. In an alternate embodiment shown in FIG. 7, noise suppression may comprise a software solution where the microphone audio signal is processed by logic circuitry 502 before being sent to transmitter 601. As discussed, the hardware solution is depicted in FIG. 6, while the software solution is depicted in FIG. 7.

With the above in mind, the apparatus shown in FIG. 6 and FIG. 7 comprise an apparatus comprising a knob configured to be rotated, a microphone, volume control circuitry, a speaker, and noise suppression circuitry (which, in a software solution comprises microprocessor 502). The noise suppression circuitry is configured to decrease an amount of background noise received from the microphone. The apparatus additionally comprises microprocessor 502 (logic circuitry) running code that instructs the processor to increase a volume of the speaker as the knob is rotated in a first direction such that the volume is increased in a continuous manner as the knob rotates, and determine a rotation angle of the knob and increase a noise suppression level as the knob is rotated in the first direction such that the noise suppression level is increased after the knob is rotated past a predetermined amount.

As discussed above, the code may also instruct the processor to determine the rotation angle of the knob and increase the volume of the speaker as the knob is rotated in the first direction such that the volume is increased in the continuous manner as the knob is rotated until the knob is rotated past a second predetermined amount, then after the knob is rotated past the second predetermined amount the volume is increased instantaneously by at least 10 percent.

Additionally, the first predetermined amount may differ from the second predetermined amount or the first predetermined amount may be substantially equal to the second predetermined amount.

As discussed, the volume is increased in a substantially linear manner as the knob is rotated in the first direction until the knob is rotated past the second predetermined amount.

In one embodiment of the present invention, no noise suppression takes place until the knob is rotated past the first predetermined amount.

Figure 8:
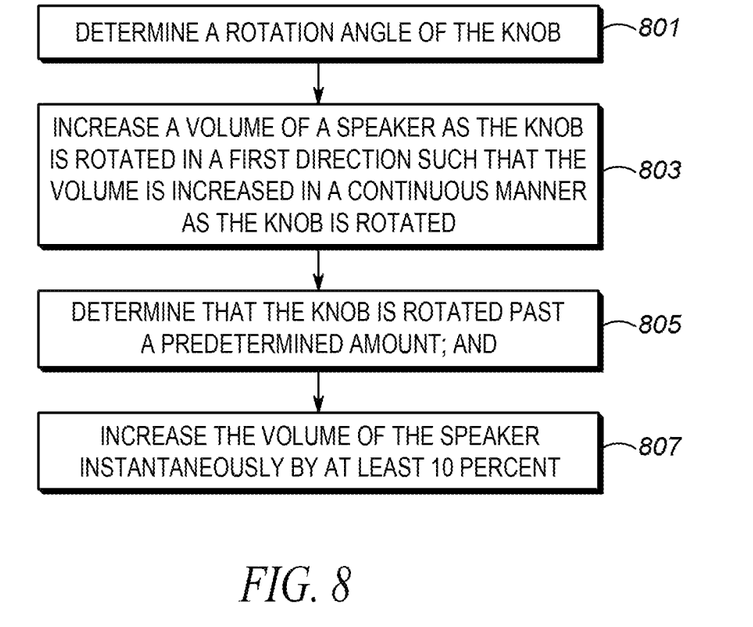
FIG. 8 is a flow chart showing operation of the device of FIG. 1.

FIG. 8 is a flow chart showing operation of the device of FIG. 1 in accordance with the first embodiment of the present invention. The logic flow begins at step 801 where logic circuitry 502 receives (determines) a rotation angle of knob 101. At step 803, logic circuitry 502 increases a volume of speaker 102 as the knob 101 is rotated in a first direction such that the volume is increased in a continuous manner as the knob is rotated. At step 805, logic circuitry 502 determines that knob 101 is rotated past a predetermined amount, and in response, increases the volume output from speaker 102 instantaneously by at least 10 percent (step 807).

Figure 9:
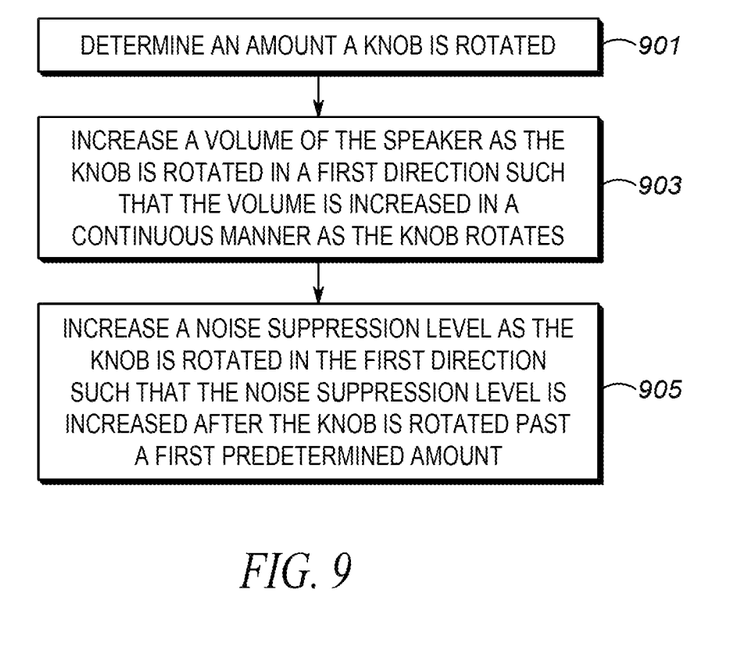
FIG. 9 is a flow chart showing operation of the device of FIG. 1 in accordance with the alternate embodiment of the present invention.

FIG. 9 is a flow chart showing operation of the device of FIG. 1 in accordance with the alternate embodiment of the present invention. The logic flow begins at step 901 where logic circuitry 502 determines an amount knob 101 is rotated. At step 903, logic circuitry increases a volume of the speaker as the knob is rotated in a first direction such that the volume is increased in a continuous manner as the knob rotates. Finally, at step 905, logic circuitry 502 increases a noise suppression level as the knob is rotated in the first direction such that the noise suppression level is increased after the knob is rotated past a first predetermined amount.

As should be apparent from this detailed description above, the operations and functions of the electronic computing device are sufficiently complex as to require their implementation on a computer system, and cannot be performed, as a practical matter, in the human mind. Electronic computing devices such as set forth herein are understood as requiring and providing speed and accuracy and complexity management that are not obtainable by human mental steps, in addition to the inherently digital nature of such operations (e.g., a human mind cannot interface directly with RAM or other digital storage, cannot transmit or receive electronic messages, electronically encoded video, electronically encoded audio, etc., and cannot provide volume boost or noise suppression of electronic signals, among other features and functions set forth herein).

In the foregoing specification, specific embodiments have been described. However, one of ordinary skill in the art appreciates that various modifications and changes can be made without departing from the scope of the invention as set forth in the claims below. For example, while both noise suppression and volume boost are described herein, device 100 may only practice noise suppression and not volume boost, or vice versa. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "one of", without a more limiting modifier such as "only one of", and when applied herein to two or more subsequently defined options such as "one of A and B" should be construed to mean an existence of any one of the options in the list alone (e.g., A alone or B alone) or any combination of two or more of the options in the list (e.g., A and B together).

A device or structure that is "configured" in a certain way is configured in at least that way, but may also be configured in ways that are not listed.

The terms "coupled", "coupling" or "connected" as used herein can have several different meanings depending on the context in which these terms are used. For example, the terms coupled, coupling, or connected can have a mechanical or electrical connotation. For example, as used herein, the terms coupled, coupling, or connected can indicate that two elements or devices are directly connected to one another or connected to one another through intermediate elements or devices via an electrical element, electrical signal or a mechanical element depending on the particular context.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Any suitable computer-usable or computer readable medium may be utilized. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. In the context of this document, a computer-usable or computer-readable medium may be any medium that can contain, store, communicate, propagate, or transport the program for use by or in connection with the instruction execution system, apparatus, or device.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. For example, computer program code for carrying out operations of various example embodiments may be written in an object oriented programming language such as Java, Smalltalk, C++, Python, or the like. However, the computer program code for carrying out operations of various example embodiments may also be written in conventional procedural programming languages, such as the "C" programming language or similar programming languages. The program code may execute entirely on a computer, partly on the computer, as a stand-alone software package, partly on the computer and partly on a remote computer or server or entirely on the remote computer or server. In the latter scenario, the remote computer or server may be connected to the computer through a local area network (LAN) or a wide area network (WAN), or the connection may be made to an external computer (for example, through the Internet using an Internet Service Provider).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An apparatus comprising:
   a knob configured to be rotated;
   a microphone;
   volume control circuitry;
   a speaker;
   noise suppression circuitry, configured to decrease an amount of background noise received from the microphone; and
   logic circuitry running code that instructs the logic circuitry to:
      increase a volume of the speaker as the knob is rotated in a first direction such that the volume is increased in a continuous manner as the knob rotates; and
      determine a rotation angle of the knob and increase a noise suppression level as the knob is rotated in the first direction such that the noise suppression level is increased after the knob is rotated past a first predetermined amount.

2. The apparatus of claim 1 wherein the code also instructs the logic circuitry to determine the rotation angle of the knob and increase the volume of the speaker as the knob is rotated in the first direction such that the volume is increased in the continuous manner as the knob is rotated until the knob is rotated past a second predetermined amount, then after the knob is rotated past the second predetermined amount the volume is increased instantaneously by at least 10 percent.

3. The apparatus of claim 2 wherein the first predetermined amount differs from the second predetermined amount.

4. The apparatus of claim 2 wherein the first predetermined amount is substantially equal to the second predetermined amount.

5. The apparatus of claim 2 wherein the volume is increased in a substantially linear manner as the knob is rotated in the first direction until the knob is rotated past the second predetermined amount.

6. The apparatus of claim 5 wherein the volume is increased by approximately 25% after the knob is rotated past the second predetermined amount.

7. The apparatus of claim 1 wherein no noise suppression takes place until the knob is rotated past the first predetermined amount.

8. An apparatus comprising:
a knob configured to be rotated;
a microphone;
volume control circuitry;
a speaker;
noise suppression circuitry, configured to decrease an amount of background noise received from the microphone; and
logic circuitry running code that instructs the logic circuitry to:
increase a volume of the speaker as the knob is rotated in a first direction such that the volume is increased in a continuous manner as the knob is rotated until the knob is rotated past a second predetermined amount, then after the knob is rotated past the second predetermined amount the volume is increased instantaneously by at least 10 percent;
determine a rotation angle of the knob and increase a noise suppression level as the knob is rotated in the first direction such that the noise suppression level is increased after the knob is rotated past a first predetermined amount;
wherein the volume is increased in a substantially linear manner as the knob is rotated in the first direction until the knob is rotated past the second predetermined amount; and
wherein no noise suppression takes place until the knob is rotated past the first predetermined amount.

9. A method comprising the steps of:
determining an amount a knob is rotated;
increasing a volume of a speaker as the knob is rotated in a first direction such that the volume is increased in a continuous manner as the knob rotates; and
increasing a noise suppression level as the knob is rotated in the first direction such that the noise suppression level is increased after the knob is rotated past a first predetermined amount.

10. The method of claim 9 wherein the volume is increased in the continuous manner as the knob is rotated until the knob is rotated past a second predetermined amount, then after the knob is rotated past the second predetermined amount the volume is increased instantaneously by at least 10 percent.

11. The method of claim 10 wherein the first predetermined amount differs from the second predetermined amount.

12. The method of claim 10 wherein the first predetermined amount is substantially equal to the second predetermined amount.

13. The method of claim 10 wherein the volume is increased in a substantially linear manner as the knob is rotated in the first direction until the knob is rotated past the second predetermined amount.

14. The method of claim 10 wherein the volume is increased by approximately 25% after the knob is rotated past the second predetermined amount.

15. The method of claim 9 wherein no noise suppression takes place until the knob is rotated past the first predetermined amount.

* * * * *